United States Patent [19]

Bhargava et al.

[11] Patent Number: 4,970,195

[45] Date of Patent: Nov. 13, 1990

[54] PROCESS OF MAKING A SUPERCONDUCTING GLASS-CERAMIC COMPOSITION

[75] Inventors: Atit Bhargava; Arun K. Varshneya; Robert L. Snyder, all of Alfred, N.Y.

[73] Assignee: Alfred University, Alfred, N.Y.

[21] Appl. No.: 250,387

[22] Filed: Sep. 27, 1988

[51] Int. Cl.$^5$ .................. H01L 23/52; H01L 39/24
[52] U.S. Cl. .................................. 505/1; 252/519; 252/521; 420/901; 423/593; 505/704; 505/739
[58] Field of Search .................. 252/519, 521; 505/1, 505/739, 704; 423/593; 427/62

[56] References Cited

U.S. PATENT DOCUMENTS 4,536,328  8/1985  Hankey ........................ 252/521

FOREIGN PATENT DOCUMENTS 0081261  3/1989  Japan ........................... 29/599

OTHER PUBLICATIONS

Masuda et al., Jap. Jour. Appl. Phys. 27 (Aug. 1988) L-417.
Bhargava et al. in High Tc Superconductors II, ed. Capone II et al., Apr. 1988, MRS Symposium, p. 59.
Nasu et al, J. Non-Cryst. Solids (Oct. 1988) vol. 105, p. 185 "Abstract".
Zhens et al, Phys. Rev. 38B (Oct. 1, 1988) p. 7166.

Primary Examiner—Upendra Roy
Attorney, Agent, or Firm—Howard J. Greenwald

[57] ABSTRACT

A process for preparing a glass-ceramic material with superconducting properties is disclosed.

In the first step of this process, a powder batch comprised of a glass-former and of barium oxide, yttrium oxide, and copper oxide (or the precursors of one or more of these oxides) is provided. These oxides (or their precursors) are present in varying amounts for the $Ba_2YCu_3O_x$ composition.

In the second step of the process, the powder batch is melted at a temperature of from about 1170 to 1300 degrees Celsius while under an oxygen-containing atmosphere.

In the third step of the process, the molten batch is rapidly cooled, thereby forming glass.

In the fourth step of the process, the glass is heat-treated at a temperature of from about 750 to about 950 degrees Celsius.

20 Claims, 1 Drawing Sheet

PROCESS OF MAKING A SUPERCONDUCTING GLASS-CERAMIC COMPOSITION

FIELD OF THE INVENTION

A process for preparing a glass-ceramic composition with superconducting properties is described. In this process, a powder batch comprised of quantities of barium oxide, yttrium oxide, copper oxide, and glass former is melted, the melt is cooled, and the glass formed upon cooling is subsequently heat-treated.

BACKGROUND OF THE INVENTION

All of the high $T_c$ superconducting materials of interest today are ceramics. Although they often have excellent superconducting properties, they are relatively brittle and difficult to form into shaped articles.

Much interest has been expressed in the superconducting composition $Ba_2YCu_3O_x$. Although a substantial amount of research has been done on this composition, applicants are not aware of any other researchers who have been able to produce glass-ceramic articles containing superconducting phases.

It is an object of this invention to provide a process for preparing a glass-ceramic with superconducting properties. It is another object of this invention to provide shaped glass-ceramic articles with superconducting properties.

SUMMARY OF THE INVENTION

In accordance with this invention, there is provided a process for preparing superconducting glass-ceramic compositions.

In the first step of this process, a powder batch comprised of a glass former (such as boron oxide) and varying amounts of barium oxide, yttrium oxide, and copper oxide (or the precurusors of such oxides) is provided.

In the second step of this process, the powder batch is melted at a temperature of from about 1170 degrees to about 1300 degrees celsius.

In the third step of the process, the melt is cooled, forming glass.

In the fourth step of the process, the glass is heat treated by being heated at a temperature of from about 750 degrees to about 950 degrees celsius.

DESCRIPTION OF THE DRAWING

The present invention will be more fully understood by reference to the following detailed description thereof, when read in connection with the attached drawing, wherein.

DESCRIPTION OF THE PREFERRED EMBODIMENTS

Figure 1:
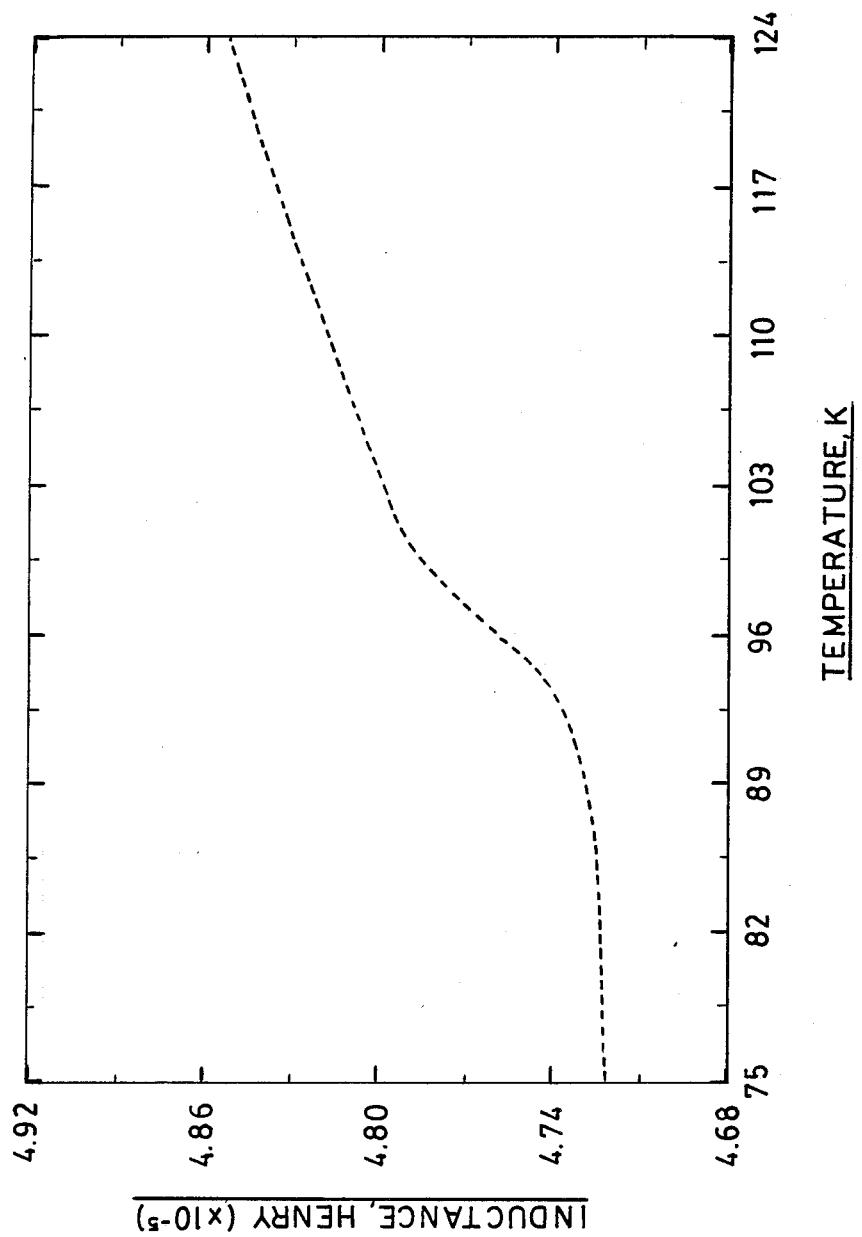
FIG. 1 is a graph illustrating the superconducting transition temperature of the glass-ceramic composition of Example 1 of this specification.

The process of this invention provides a glass ceramic superconducting composition. The process involves several steps, the first of which is the provision of a mixture of a barium compound, a yttrium compound, a copper compound, and a boron oxide glass former with a specified stoichiometry. One can use the oxides of barium, yttrium, copper, and boron in this mixture. Alternatively, one can use other compounds of barium and/or yttrium and/or copper and/or boron which, when the mixture is heated to a temperature of from about 1170 degrees to about 1300 degrees Celsius, will decompose to yield the oxides. When reference is made in the claims of this case to a mixture comprised of barium oxide, yttrium oxide, and cupric oxide wherein the concentration of each reagent is calculated on the oxide basis, it is to be understood that the mixture may contain either the oxide or oxide-precursor forms of each of the barium, yttrium, copper, and boron components.

The mixture provided in the first step of the process is comprised of from about 35 to about 50 percent, by combined weight of barium oxide, cupric oxide, yttrium oxide, and boron oxide glass former, of barium oxide. It is preferred that the mixture contain from about 40 to about 46 weight percent of barium oxide. If barium oxide is used as the barium compound, then the specified weight percent of the oxide is incorporated into the mixture. If a barium compound other than barium oxide is used, then one must calculate how much of that barium compound will yield the specified weight percent of barium oxide upon decomposition.

The mixture is also comprised of yttrium oxide, copper oxide, and boron oxide. If a non-oxide compound is used for the yttrium and/or the cupric and/or the boron component, the weight percents of each of these is specified in terms of their oxide; one must calculate how much of the non-oxide material must be used to yield upon decomposition the desired amount of the oxide.

In one embodiment, the yttrium, copper, barium, and boron components in the mixture are reagent grade.

In one embodiment, one uses a barium compound which, after having been subjected to a melting temperature of from about 1100 degrees to about 1350 degrees Celsius, does not leave a residue of ions in the melt, can be used in the process. In another embodiment, one may use an yttrium compound and/or a copper compound and/or a boron glass forme which does not leave such ion residue. As used in this specification, the term "ions" includes any electrically charged atom, radical, or molecule, but it specifically excludes barium ions, oxygen ions, boron ions, copper ions, and yttrium ions.

Thus, by way of illustration, barium oxide can be used in this process. Although barium and oxygen ions may be left in the melt, they are not "ions" within the meaning of the this term as used in this case.

Thus, by way of illustration, barium carbonate can be used. The carbonate portion of the molecule will form carbon dioxide and will leave the melt. The barium ions left in the melt are not ions within the meaning of the specification.

Thus, for example, barium nitrate may be used; in this case, the nitrate portion of the the molecule forms gaseous ions of nitrogen which leave the melt.

Thus, for example, barium oxalate can be used; the oxalate portion of the compound forms gaseous oxides of carbon.

Other barium compounds which can be used include barium hydroxide, barium peroxide, barium perhydrateoxide, barium acetate, and the like.

The preferred barium compounds are selected from the group consisting of barium oxide and barium carbonate. The most preferred barium compound is barium oxide.

The mixture is also comprised of from about 6 to about 18 weight percent of a boron oxide glass former, based upon the combined weight of the barium compound, the yttrium compound, the copper compound, and the glass former. It is preferred to have the mixture comprise from about 7.5 to about 12 weight percent of the boron oxide glass former. It is most preferred to have the mixture comprise from about 8 to about 10 weight percent of the boron oxide glass former.

The boron oxide glass former is selected from boron oxide and a group of compounds which forms boron oxide upon decomposition and includes, e.g., boric acid, metaboric acid, tetraboric acid, mixtures thereof, and the like. The preferred boron oxide glass former is boron oxide. If the glass former used is a composition other than boron oxide, one can calulate the amount of the glass former to be used which will yield the desired amount of boron oxide upon decomposition.

The mixture is also comprised of from about 25 to about 35 percent of a cupric oxide, by combined weight of barium oxide, yttrium oxide, cupric oxide, and boron oxide. It is preferred that the mixture comprise from about 29 to about 33 weight percent of cupric oxide. The cupric compound which may be used to furnish cupric oxide to the mixture is preferably selected from the group consisting of cupric oxide, other oxides of copper, acetates of copper, carbonates of copper, copper benzoate, copper metaborate, copper hydroxide, copper nitrates, copper oxalate, copper stearate, and the like.

The mixture is also comprised of from about 12 to about 18 weight percent of yttrium oxide, based upon the combined weight of barium oxide, cupric oxide, boron oxide glass former, and ytttrium oxide. It is preferred that the mixture comprise from about 13 to about 16 weight percent of the yttrium oxide. If a compound other than yttrium oxide is used in the mixture, one can calculate the amount of such compound which will, upon decomposition, yield the desired concentration of yttrium oxide. Suitable yttrium compounds include yttrium oxide, yttrium acetate, yttrium carbonate, yttrium hydroxide, yttrium nitrate, yttrium oxalate, and the like.

Suitable amounts of each of the barium, boron oxide glass former, yttrium, and copper components are weighed by means well known to those skilled in the art. Thereafter, the weighed materials are charged to a vessel wherein they may be ground and/or mixed.

In one embodiment, the grinding of the batch is preferably conducted until all of the particles are smaller than about 30 microns. Thus, by way of illustration, one may grind the batch in an agate pestle with a mortar.

The ground and/or mixed particles may then be further mixed until they are homogeneously distributed. One may effect such mixing by conventional means well known to those in the art. Thus, one may mix the particles by hand. Thus, one may mix the particles in a Spex Mixer/Mill, model number 8000, manufactured by Spex Industries, Inc. of Scotch Plains, N.J. Thus, e.g., one may utilize a tumbling mill.

The mixed particles may then be charged into an inert crucible which will not react with the batch to any appreciable extent during melting and will not decompose during the melting. It is preferred to use an inert crucible selected from the group consisting of platinum crucibles and platinum-gold crucibles and the like. In one embodiment, it is preferred to use a platinum crucible for this purpose. Although this crucible is often not suitable for heating superconducting precursor oxide mixtures other than those described in this invention, and is often reactive with such mixtures, it is especially useful with the glass-forming oxide mixtures of this invention.

The inert crucible containing the batch is then heated to a temperature which will effect melting of the batch. The melting temperature is from about 1170 degrees to about 1300 degrees Celsius. The preferred melting temperature is from about 1240 degrees to about 1270 degrees Celsius. In general, the batch is subjected to the melting temperature for the smallest time possible to effect complete melting without causing reaction with the crucible, In one embodiment, the melting time is less than about 45 minutes. The preferred melting time is usually less than 30 minutes. In the most preferred embodiment, the melting time is less than about 25 minutes.

The melting is effected under an oxygen-containing atmosphere selected from the group consisting of air, oxygen, and mixtures. Oxygen is the preferred oxygen-containing gas. In one embodiment, the oxygen may be bubbled through the melt.

The melting may be effected in any furnace which can provide the required melt temperatures. Thus, by way of illustration and not limitation, one may use a Fast Melt melting furnace (available from the Keith Company, Inc. of 8323 Loch Lommond, Pico Rivera, Calif. 90660). Thus, e.g., one can use conventional glass melting refractory blocks to conduct the melting on a large scale involving tons of material. Other means of melting the batch will be apparent to those skilled in the art.

In one embodiment, the batch is placed into the furnace at ambient temperature, and then the furnace is raised to the temperature of the melt. It is preferred to raise the furnace to the melt temperature at a rate that will allow the reactants to react/decompose completely before me)ting temperature is acquired. In general, the rate of temperature increase is from about 5 degrees to 40 degrees Celsius per minute. It is preferred that the rate of temperature increase be from about 15 to about 20 degrees Celsius per minute.

In another embodiment, the furnace is preheated until it is at or near the melting temperature, and the batch is then inserted into the preheated furnace.

The melting of the batch is continued until the batch is molten. One can determine when the batch is molten by visual means, by viscosity measurements, and by other means well known to those skilled in the art.

Once the batch has melted, it is cooled. In one preferred embodiment, it is rapidly cooled by conventional means well known to those skilled in the art, thereby producing a glass. The cooling cools the melt suddenly so that its temperature is preferably reduced to ambient in less than about 30 seconds and, more preferably, in less than about 10 seconds.

The cooling may be conducted by means well known to those skilled in the art. Thus, by way of illustration and not limitation, one can use the techniques disclosed by Andrew Herczog in his paper entitled "Microcrystalline $BaTiO_3$ by Crystallization from Glass," Journal of the American Ceramic Society, Vol. 47, No. 3, pages 107–115 (Mar. 21, 1964), the disclosure of which is hereby incorporated by reference into this specification. Thus, by way of illustration and not limitation, one can pour the melt onto an aluminum plate and roll it with an aluminum roller. Other suitable means of cooling will be apparent to those in the art.

In one embodiment, the melt is rapidly cooled by fritting. As those skilled in the art are aware, the melt may be fritted by allowing the stream of molten glass to fall into water. Alternatively, one can expose the stream of molten glass to a blast of air and water, or pass the stream between water-cooled rolls. Suitable means of fritting are disclosed in A. E. Dodd's "Dictionary of Ceramics . . . ," (Philosphical Library, Inc., New York, 1964), the disclosure of which is hereby incorporated by reference into this specification.

The cooled glass is then heat-treated to form the glass-ceramic composition of this invention. The glass is subjected to a temperature of from about 750 degrees to about 950 degrees Celsius for at least about 10 minutes. It is preferred to subject the glass to a temperature of from about 850 degrees to about 950 degrees Celsius for from about 1 to about 2 hours. In the most preferred embodiment, the heat treatment is conducted at a temperature of from about 875 degrees to about 925 degrees Celsius for from about 60 to about 90 minutes.

It is preferred to conduct the heat treatment while the glass is on an inert substrate, such as platinum or platinum-gold. The heat-treatment is preferably conducted under an oxygen-containing atmosphere such as, e.g., air or oxygen.

After the heat treatment, the glass-ceramic material is preferably cooled slowly at a rate of from about 5 degrees to about 10 degrees per minute.

In one embodiment, the glass-ceramic material is heated for from about 5 to about 20 hours to volatilize a large portion of the glass, leaving crystals of the crystaline phases on a substrate.

In another embodiment, the glass or the molten glass is contacted with a substrate. In one embodiment, the glass material produced prior to the aforementioned heat treatment is contacted with the substrate and thereafter melted. In another embodiment, the molten glass produced from the batch in the furnace is contacted with the substrate and allowed to cool. In both embodiments, a molten glass composition is contacted with the substrate at some point and allowed to cool on it. After the molten glass has been allowed to cool on the substrate, thereby forming a glass-ceramic coating, it may be heat treated at 750 degrees–950 degrees Celsius in the manner described above.

In another embodiment, the glass produced by cooling the melt from the furnace may be fritted, the frit may be placed onto the isostructural substrate, and the frit may then be melted and heat treated as described above.

In another embodiment, the powder batch may be melted and/or vaporized by means well known to those in the art. Thus, for example, one may use inductance plasma, vapor deposition, or laser energy. In the embodiment wherein the powder batch is vaporized and-/or converted into plasma, the vapor/plasma may be allowed to condense upon a suitable substrate (like, e.g., the isostructural substrate described above), allowed to cool, and then heat treated.

The goal of this treatement is produce a material which is a distorted, oxygen-deficient perovskite, and an isostructural substrate is preferably used to obtain this goal. The term "isostructural," as used in this specification, refers to a material with the perovskite crystal structure. This perovskite crystal structure is described on page 67 of W. D. Kingery et al.'s "Introduction to Ceramics," Second Edition (John Wiley and Sons, New York, 1976), the disclosure of which is hereby incorporated by reference into this specification. As those skilled in the art are aware, some materials which exhibit the perovskite crystal structure include barium titanate, barium niobate, barium tantalate, strontium titanate, strontium niobate, strontium tantalate, lead titanate, calcium titante, mixtures thereof, and the like. Other substrates which may be used include magnesium oxide and aluminum oxide.

In one embodiment, the molten batch produced by the melting of the powder is formed into shaped objects prior to the time it is heat treated. The glass melt may be formed by techniques well known to those skilled in the art. Thus, for example, one may use the techniques described in Alexis G. Pincus' "Forming in the Glass Industry," Parts One and Two (Ashlee Publishing Company, Inc., New York, 1983), the disclosure of which is hereby incorporated by reference into this specification. Thus, one may produce glass sheets, pressed ware, blown ware, container ware, spheres, tubings, rods, fibers, and the like.

In one preferred embodiment, during the batch melting and/or the glass remelting steps, oxygen is bubbled thorugh the melt in order to increase the superconducting ability of the material.

In another embodiment, a phosphorous pentoxide or a silicon dioxide glass former is used. It is preferred, with either or both of these glass formers, to utilize a different stoichiometry than that described above for the boron oxide glass former compositions. In the boron oxide glass former compositions, described hereinabove, the amounts of barium compound, yttrium compound, and copper compound charged to the batch do not reflect the stoichiometry of the superconductive $Ba_2YCu_3O_x$ composition; thus, these compositions are referred to as "varying" to indicate this fact.

In another embodiment, the process of this invention is utilized with superconducting compositions other than the barium-yttrium-copper composition. In this embodiment, different glass formers and/or different stoichiometries and compounds are used. What this embodiment has in common with the embodiment claimed in this case, however, is that: (1) both embodiments utilize powder batches which contain glass forming composition, (2) both embodiments use varying amounts of ingredients, and (3) both embodiments produce glass melts which can be formed by conventional means and which, after heat treatment, develop ceramic phases, at least some of which possess superconducting properties.

Without wishing to be bound to any particular theory, applicants believe that the glass-forming composition becomes saturated with cations from the batch so that further addition of cations results in precipitation of the added cations as a new compound upon heat treatment. Thus, by way of illustration, in the embodiment illustrated in Example 1 there is an excess of barium ions, yttrium ions, and copper ions; inasmuch as the glass can hold differing amounts of each of these ions, there is an excess in different proportions of these ions. Upon heat treatment of the glass melt, these excess ions precipitate, thereby forming the desired superconductive compound.

Each particular superconductor may require differing amounts of the excess cations, and thus may require different stoichiometries for the powder batch. The principal of formation of the superconducting phase, however, is the same.

The heat-treated glass ceramic composition produced by the process of this invention is a glass-ceramic. As is known to those skilled in the art, a glass-ceramic material is a material which has fine, uniform dispersion of crystals in glass and are usually produced by special heat treatment of glass. See, e.g., Anon., Bull. Am.

Ceram. Soc., 36, 579 (1957) and S. D. Stookey, U.S. Pat. Nos. 2,920,971 and 2,933,857, the disclosures of which are hereby incorporated by reference into this specification.

In one preferred embodiment, the glass-ceramic compositions of this invention have high strength and impact resistance, low chemical reactivity, a range of coefficients of thermal expansion, and zero open porosity.

The glass-ceramic compositions of this invention contain non-stoichiometric amounts of barium, yttrium, and copper. The well-known 2/1/3 barium/yttrium/copper superconductor contains precisely 2 moles of barium to one mole of yttrium to 3 moles copper; applicants' compositions do not contain this mole ratio.

The following examples are presented to illustrate the claimed invention but are not to be deemed limitative thereof. Unless otherwise specified, all parts are by weight and all temperatures are in degrees Celsius.

EXAMPLE 1

The reagents used in this example were cupric oxide, yttrium oxide, barium oxide, and boron oxide.

The cupric oxide was obtained from the J. T. Baker Chemical Company of Phillipsburg, New Jersey 08865. It was reagent grade "BAKER ANALYZED REAGENT" and was identified as reagent number 1814-01 and lot number A35084.

The yttrium oxide was obtained from the Research Chemicals Company of Post Office box 14588, Phoenix, Ariz. It was reagent grade, and it was identified as lot number YO-4-256.

The barium oxide was obtained from Apache Chemicals, Inc. of Post Office Box 126, Seward, Ill. It was reagent grade, and it was identified as reagent number 0810 and lot number 08218.

The boron oxide was obtained from Fischer Scientific company of Springfield, N.J. It was reagent (purified) grade, and it was identified as catalog number A76-3.

5.2417 grams of the barium oxide, 3.791 grams of the cupric oxide, 1.7764 grams of the yttrium oxide, and 1.1904 grams of the boron oxide were each separately weighed out on an AND Electronic Balance, model FX 300, serial number 5000550 (manufactured by the AND Company, Ltd. of Japan).

The barium oxide, the cupric oxide, and the yttrium oxide, and the boron oxide were then charged to an agate mortar and pestle and ground to a fine powder in about 20 minutes. Thereafter, the ground batch was charged into a dry plastic bottle, and the plastic bottle was then shaken by hand for about 20 minutes.

The plastic bottle containing the shaken material was then inserted into a SPEX Mixer/Mill, model number 8000 (manufactured by Spex Industries Inc. of Scotch Plains, N.J. The bottle was mixed in the Mixer/Mill for about 20 minutes.

The mixed material in the bottle was then discharged from the bottle into a platinum crucible. The crucible containing the batch was inserted into a Fast Melt melting furnace (available from the Keith Company, Inc. of 8323 Loch Lommond, Pico Rivera, Calif. 90660). The batch was heated to a temperature of 1270 degrees Celsius and held at this temperature for 20 minutes, at which time it was molten.

The molten batch was taken out of the furnace, and the melt was poured onto an aluminum plate which had a surface of about one square foot. The poured melt was simultaneously rolled with an aluminum roller with a diameter of about 2.0 inches and a length of about 6.0 inches in order to cool it. Glass fragments were formed which were about 1 millimeter thick and about 1.0 inch long.

A sample of the glass fragments was subject to differential scanning calorimetry to determine whether it was in fact a glass. Testing was conducted on a 910 Differential Scanning Calorimeter using a 9900 Computer/Thermal Analyzer (model number 910001-908, serial number 1650, manufactured by E. I. DuPont de Nemours & Company, Wilmington, Del.); the evaluation was conducted in accordance with the procedure described in the Operator's Manual for the 9000 Thermal Analysis System (publication PN 996203.001, Revision A, Issued February, 1985 by the DuPont Company). The heating rate was 20 degrees Celsius per minute under helium atmosphere. A glass transition temperature of about 594 degrees Celsius (determined by the tangent-intercept technique) was observed.

The glass fragments were placed onto a platinum substrate and inserted into a high-temperature annealing furnace manufactured by the Thermolyne Company of Dubuque, Iowa, model number 48000, serial number 48000426. After the sample was inserted into the furnace, the temperature of the furnace was raised from ambient to 900 degrees Celsius at the rate of 10 degrees centigrade per minute. Thereafter, the samples were was maintained at 900 degrees Celsius for two hours. Thereafter, the furnace was cooled at a rate of 10 degrees Celsius per minute to ambient temperature. The cooled, crystallized sample was removed from the furnace. No reaction between the sample and the platinum substrate was observed.

A portion of the cooled, crystallized sample was then evaluated by Powder X-Ray Diffraction on a Siemens D-500 Diffractometer (model number C72298-A223-B-9-POZ-288, manufactured by Siemens Company of West Germany) using copper K-alpha radiation and a diffracted beam graphite monocrometer. The presence of the $Ba_2YCu_3O_x$ phase, known to supercondut, was observed from the data obtained.

A portion of the cooled, crystallized sample was evaluated to determine its transition temperature in accordance with the procedure described in T. K. Vethanayagam et al.'s paper entitled "Inductance Techniques for Measuring Transition Temperatures of Superconducting Powders," submitted to "Superconductivity: Theory and Applications", Buffalo, N.Y., in May, 1988; the disclosure of this paper is hereby incorporated by reference into this specification. An HP 4192A LF Impedance Analyzer, serial number 2150J02333 (manufactured by Yokogawa Hewlett Packard, Tokyo, Japan) was used for this evaluation; measurements were conducted at a frequency of 100 kiloherz. The results are shown in FIG. 1. A sharp increase in the inductance of the sample was observed from between 87 degrees to about 102 degrees Kelvin.

A portion of the cooled, crystallized sample was evaluated to determine whether it exhibited a Meissner effect. The Meissner effect is described in, e.g., an article by Meissner, W. and Ochsenfeld, R. (1933), Ein neuer Effekt bei Eintritt der Supraleitfahigkeit, Naturwissenschaften 21, 787–788. The evaluation was conducted with the well-known SQUID magnetization measurement technique. The SQUID (superconducting quantum interference device) is described, e.g., in J. L. Mayo's "Superconductivity" (Tab Books Inc, Blue Ridge Summit, Pa., 1988), the disclosure of which is hereby incorporated by reference into this specification. As is known to those skilled in the art, the SQUID is a superconducting ring that couples with one or two Josephson junctions.

10.7 milligrams of the sample were charged into the sample space of the SQUID (100 gauss magnetic field), the temperature was varied, and the magnetization signal of the sample was detected. At a temperature of 65 degrees Kelvin, a Meissner effect reading of $-0.4 \times 10^{-4}$ electromagetic units per gram was obtained. At a temperature of 87 degrees Kelvin, a reading of 0.0 electromagnetic units per gram was obtained. This indicates there is a superconducting transition taking place at the temperature around 87 degrees Kelvin under 100 gauss of magnetic field.

EXAMPLES 2 AND 3

The procedure of Example 1 was repeated two times to determine whether the results obtained were reproducible. In each experiment, substantially identical results were obtained.

EXAMPLE 4

In substantial accordance with the procedure of Example 1, a molten batch was prepared. The molten batch was removed from the furance, a glass rod was inserted into the batch, and the rod was then removed from the batch, thereby pulling fibers with it. The glass fibers thus formed were about 0.1 millimeter wide and about 2.0 feet long.

COMPARATIVE EXAMPLE 5

The procedure of Example 1 was substantially followed with the exceptions that 2.729 grams of barium oxide, 1.549 grams of copper oxide, 0.4350 grams of yttrium oxide, and 5.536 grams of boron oxide were used, a slip cast silica crucible (type 138506, lot number 4-81-542 available from the Fireline Company, Ohio) was used instead of the platinum crucible, and the batch was melted at 1300 degrees Celsius for 25 minutes. Analysis indicated that the glass ceramic material obtained after heat treatment did not contain the superconducting phase.

COMPARATIVE EXAMPLE 6

A glass was made in substantial accordance with the procedure of Example 4. 1.085 grams of this glass were mixed with 4.340 grams of the mixed oxides of barium, yttrium, and copper present in proper stoichiometric ratio for the $Ba_2YCu_3O_x$ compound. The mixture of the glass and the powder was remelted at 1300 degrees Celsius for 20 minutes in accordance with the procedure of Example 1; thereafter, the glass formed was heat treated and evaluated in accordance with the procedure of Example 1. Analysis indicated that the glass ceramic material obtained after heat treatment did not show high-temperature superconductivity.

COMPARATIVE EXAMPLE 7

The procedure of Example 6 was substantially followed with the exception that a platinum crucible instead of a silica crucible was used. During the melting of the second glass batch, the batch reacted with the platinum crucible and burned a hole in it. After this occurred, the experiment was abandoned.

It is to be understood that the aforementioned description is illustrative only and that changes can be made in the apparatus, the ingredients and their proportions, and in the sequence of combinations and process steps and well as in other aspects of the invention discussed herein without departing from the scope of the invention defined in the following claims.

We claim:

1. A process for preparing a superconductive glass-ceramic composition, comprising the steps of:
   (a) providing a homogeneous powder batch, wherein said batch is comprised of from about 35 to about 50 weight percent of barium oxide, from about 6 to about 18 weight percent of boron oxide glass former, from about 25 to about 35 weight percent of cupric oxide, and from about 12 to about 18 weight percent of yttrium oxide, and wherein the concentration of each of such reagents is calculated on the oxide basis in weight percent, by combined weight of the barium, yttrium, copper, and boron components;
   (b) heating said homogeneous powder batch to a temperature of from about 1170 degrees to about 1300 degrees Celsius until the batch becomes molten, wherein said powder batch is maintained under an oxygen-containing atmosphere during said heating;
   (c) reducing the temperature of the molten batch from the temperature of the melt to ambient temperature, thereby producing glass; and
   (d) heat-treating said glass by subjecting it to a temperature of from about 750 degrees to about 950 degrees celsius.

2. The process as recited in claim 1, wherein said oxygen-containing atmosphere is oxygen; and wherein said powder batch is placed into an inert container selected from the group consisting of platinum containers and platinum-gold containers prior to being melted.

3. The process as recited in claim 1, wherein said molten batch is formed into a shaped object prior to the time it is heat-treated.

4. The process as recited in claim 2, wherein said inert container consists essentially of platinum.

5. The process as recited in claim 3, wherein said molten batch is formed into a fiber prior to the time it is heat-treated.

6. The process as recited in claim 3, wherein said molten batch is formed into spherical-shaped objects and such objects are thereafter heat-treated.

7. The process as recited in claim 4, wherein said homogeneous powder batch is placed in a furnace at ambient temperature and, thereafter, the temperature of the furnace is raised from ambient to from about 1170 degrees to about 1300 degrees Celsius at a rate of from about 5 degrees to about 40 degrees per minute.

8. The process as recited in claim 7, wherein said homogeneous powder batch is subjected to said temperature of from about 1170 degrees to about 1300 degrees Celsius for no more than about 30 minutes.

9. The process as recited in claim 8, wherein said powder batch is comprised of from about 40 to about 46 weight percent of barium oxide.

10. The process as recited in claim 9, wherein said powder batch is comprised of from about 7.5 to about 12 weight percent of said boron oxide glass former.

11. The process as recited in claim 10, wherein said powder batch is comprised of from about 29 to about 33 weight percent of said cupric oxide.

12. The process as recited in claim 11, wherein said powder batch is comprised of from about 13 to about 16 weight percent of said yttrium oxide.

13. The process as recited in claim 12, wherein said powder batch is comprised of from about 8 to about 10 weight percent of said boron oxide glass former.

14. The process as recited in claim 13, wherein said boron oxide glass former is boron oxide.

15. The process as recited in claim 14, wherein said platinum container is a platinum crucible.

16. The process as recited in claim 15, wherein said powder batch is subjected to a temperature of from about 1240 degrees to about 1270 degrees Celsius for less than about 25 minutes until it is molten.

17. The process as recited in claim 16, wherein, after said powder batch has been placed into said furnace, the temperature of the furnace is raised from ambient temperature to a temperature of from about 1240 degrees to about 1270 degrees Celsius at a rate of from about 15 degrees to about 20 degrees per minute.

18. The process as recited in claim 17, wherein the temperature of the molten batch is reduced from the melt temperature to ambient temperature in less than about 10 seconds.

19. The process as recited in claim 18, wherein said glass is heat-treated for from about 60 to about 120 minutes.

20. The process as recited in claim 19, wherein said glass is heat-treated for from about 60 to about 90 minutes.

* * * * *